(12) United States Patent
Takemiya et al.

(10) Patent No.: US 7,854,777 B2
(45) Date of Patent: Dec. 21, 2010

(54) POLISHING COMPOUND, METHOD FOR PRODUCTION THEREOF, AND POLISHING METHOD

(75) Inventors: Satoshi Takemiya, Yokohama (JP); Norihito Nakazawa, Yokohama (JP); Yoshinori Kon, Yokohama (JP)

(73) Assignees: Asahi Glass Company, Limited, Tokyo (JP); Seimi Chemical Co., Ltd., Chigasaki-shi (JP)

( * ) Notice: Subject to any disclaimer, the term of this patent is extended or adjusted under 35 U.S.C. 154(b) by 0 days.

(21) Appl. No.: 10/831,618

(22) Filed: Apr. 26, 2004

(65) Prior Publication Data
US 2004/0194392 A1  Oct. 7, 2004

Related U.S. Application Data

(63) Continuation of application No. PCT/JP02/10996, filed on Oct. 23, 2002.

(30) Foreign Application Priority Data

Oct. 26, 2001 (JP) ............................ 2001-329148
Nov. 19, 2001 (JP) ............................ 2001-353207

(51) Int. Cl.
*B24D 3/02* (2006.01)
*C09C 1/68* (2006.01)
*C09K 3/14* (2006.01)
*C09G 1/02* (2006.01)
*H01L 21/302* (2006.01)
*H01L 21/461* (2006.01)

(52) U.S. Cl. ........................ 51/308; 51/307; 51/309; 106/3; 438/692; 438/693

(58) Field of Classification Search ............... 51/307, 51/308, 309; 106/3; 438/692–693
See application file for complete search history.

(56) References Cited

U.S. PATENT DOCUMENTS 5,700,383 A * 12/1997 Feller et al. ............... 438/645

(Continued)

FOREIGN PATENT DOCUMENTS

EP  1150341  * 10/2001

(Continued)

OTHER PUBLICATIONS

U.S. Appl. No. 12/644,137, filed Dec. 22, 2009, Takemiya, et al.

(Continued)

*Primary Examiner*—Anthony J Green
*Assistant Examiner*—Pegah Parvini
(74) *Attorney, Agent, or Firm*—Oblon, Spivak, McClelland, Maier & Neustadt, L.L.P.

(57) ABSTRACT

A heterocyclic benzene compound such as benzotriazole, is dissolved in at least one substance selected from the group consisting of a primary alcohol having from 1 to 4 carbon atoms, a glycol having from 2 to 4 carbon atoms, an ether represented by the Formula 2 (wherein m is an integer of from 1 to 4), N-methyl-2-pyrrolidone, N,N-dimethylformamide, dimethyl sulfoxide, γ-butyrolactone and propylene carbonate, and an aqueous dispersion of fine oxide particles which constitute abrasive grains is mixed therewith, whereby a polishing compound is obtained. By use of this polishing compound in polishing a substrate provided with an insulating film 2 on which a wiring metal film 4 and a barrier film 3 are formed, the formation of an embedded wiring 5 is made possible with low dishing, low erosion and low scratching at a high removal rate.

3 Claims, 3 Drawing Sheets

U.S. PATENT DOCUMENTS

| | | | |
|---|---|---|---|
| 5,895,509 A | 4/1999 | Ohmi et al. | |
| 5,897,375 A * | 4/1999 | Watts et al. | 438/693 |
| 6,348,076 B1 * | 2/2002 | Canaperi et al. | 51/309 |
| 6,355,075 B1 | 3/2002 | Ina et al. | |
| 6,569,349 B1 * | 5/2003 | Wang et al. | 252/79.1 |
| 6,579,153 B2 * | 6/2003 | Uchikura et al. | 451/41 |
| 6,620,215 B2 * | 9/2003 | Li et al. | 51/298 |
| 6,743,078 B2 * | 6/2004 | McClain et al. | 451/41 |
| 6,750,128 B2 * | 6/2004 | Kondo et al. | 438/591 |
| 6,774,041 B1 | 8/2004 | Kondo et al. | |
| 6,800,105 B2 | 10/2004 | Ueda et al. | |
| 7,250,369 B1 | 7/2007 | Kondoh et al. | |
| 2001/0049912 A1 * | 12/2001 | Motonari et al. | 51/307 |
| 2002/0098697 A1 * | 7/2002 | Shimazu et al. | 438/691 |
| 2002/0104269 A1 * | 8/2002 | Sun et al. | 51/309 |
| 2003/0073593 A1 * | 4/2003 | Brigham et al. | 510/175 |
| 2003/0168627 A1 * | 9/2003 | Singh et al. | 252/79.1 |

FOREIGN PATENT DOCUMENTS

| | | |
|---|---|---|
| EP | 1 279 708 | 1/2003 |
| JP | 10-166258 | 6/1998 |
| JP | 11-40526 | 2/1999 |
| JP | 11-238709 | 8/1999 |
| JP | 2001-31950 | 6/2001 |
| JP | 2001-185515 | 7/2001 |
| JP | 2001-267273 | 9/2001 |
| WO | 99/47618 | 9/1999 |
| WO | 00/39844 | 7/2000 |

OTHER PUBLICATIONS

U.S. Appl. No. 11/515,855, filed Sep. 6, 2006, Takemiya, et al.
U.S. Appl. No. 12/003,668, filed Dec. 28, 2007, Takemiya.
U.S. Appl. No. 12/045,325, filed Mar. 10, 2008, Takemiya.

* cited by examiner

POLISHING COMPOUND, METHOD FOR PRODUCTION THEREOF, AND POLISHING METHOD

TECHNICAL FIELD

The present invention relates to a polishing compound for use in semiconductor device fabrication processes. More particularly, the present invention relates to a polishing compound which is suitable for forming an embedded metal wiring in which a tantalum-based metal is used as the material for a barrier film, and a method for polishing substrates using the polishing compound.

BACKGROUND ART

Recently, as the integration and functionality of semiconductor integrated circuits have been increasing, there has been a demand for development of micro-fabrication techniques for miniaturization and densification. Planarization techniques for interlayer insulating films and embedded wirings are important in semiconductor device fabrication processes, in particular, in the process of forming multilayered wirings. That is, as the multilayered wirings are increasingly formed due to the miniaturization and densification in the semiconductor fabrication processes, the degree of irregularity tends to increase in the surfaces of the individual layers, resulting in a situation where the difference in level exceeds the depth of focus in lithography. In order to avoid such a problem, high planarization techniques are important in the process of forming multilayered wirings.

As the material for such wirings, Cu has been receiving attention because of its lower resistivity compared with conventionally used Al alloys and also because of its excellence in electromigration resistance. Since the vapor pressure of copper chloride gas is low, it is difficult to form Cu into the shape of wirings by Reactive Ion Etching (RIE) which has been conventionally used. Therefore, in order to form the wirings, a Damascene method is used. In this process, gap fillings such as trench patterns and via holes, are formed in an insulating film. A barrier film is then formed thereon, and then Cu is deposited so as to be embedded in the trench portions to form a film by sputtering, plating, or the like. Subsequently, the excess Cu and the barrier film are removed by Chemical Mechanical Polishing (hereinafter referred to as "CMP") until the surface of the insulating film is exposed, other than the portions corresponding to the recesses, whereby the surface is planarized. Recently, a Dual Damascene method has been predominantly used, in which Cu wirings embedded with Cu and via holes are simultaneously formed.

In the formation of Cu interconnect, in order to prevent Cu from diffusing into the insulating film, a barrier film composed of Ta, a tantalum alloy, or a tantalum compound such as tantalum nitride, is formed. Therefore, in the portions other than those corresponding to Cu-embedded wirings, the exposed barrier film must be removed by CMP. However, since the barrier film is significantly harder than Cu, it is often not possible to achieve a sufficient removal rate. Accordingly, a two-stage polishing method has been proposed, which includes a first polishing step of removing the wiring metal film and a second polishing step of removing the barrier film, as shown in FIG. 1.

FIG. 1 includes cross-sectional views which show a method for forming embedded wirings by CMP. FIG. 1(a) shows the state before polishing; FIG. 1(b) shows the state after the first polishing step in which a wiring metal film 4 is removed; and FIG. 1(c) shows the state after the second polishing step in which a barrier film 3 is removed. As shown in FIG. 1(a), an insulating film 2 provided with trenches for forming embedded wirings 5 is formed on a Si substrate 1. The barrier film 3 is formed on the insulating film 2, and the wiring metal film (Cu film) 4 is formed further thereon. The wiring metal film 4 is removed in the first polishing step, and the barrier film 3 is removed in the second polishing step.

However, in CMP using the conventional polishing compound, an increase in dishing and erosion in the Cu-embedded wirings 5 will give rise to problems. Here, dishing is likely to occur in a wide wiring portion, and signifies a state in which the wiring metal film 4 in the wiring portion is over-polished so that the central part thereof is concaved as shown in FIG. 2. Erosion is likely to occur in a dense wiring portion, and signifies such a phenomenon that the insulating film 2 in the dense wiring portion is over-polished and the insulating film 2 becomes thin as shown in FIG. 3. In FIGS. 2 and 3, the barrier film 3 is not shown.

When the conventional polishing compound is used, the removal rate in the barrier film 3 is significantly smaller than the removal rate in the wiring metal film 4, so that Cu in the wiring portions are over-polished while the barrier film 3 is removed, resulting in a large extent of dishing. Furthermore, the polishing pressure applied to the barrier film 3 and the insulating film 2 therebeneath in a highly dense wiring portion becomes relatively greater than that applied to a less dense wiring portion, so that the removal rate in the second polishing step largely differs depending on the wiring density, and the insulating film 2 in the highly dense wiring portion is over-polished, resulting in a large extent of erosion. When such dishing or erosion occurs, the wiring resistance tends to increase and electromigration tends to easily occur, resulting in the reduction of the reliability of devices.

Ta and tantalum compounds used for the barrier film are difficult to etch chemically. Because of their higher hardness than Cu, Ta and tantalum compounds are difficult to remove mechanically by polishing. If abrasive grains with a higher hardness are used in order to increase the removal rate, scratches will occur in the soft Cu wirings, resulting in problems such as electrical defects. If the concentration of abrasive grains is increased, the removal rate of the insulating film is also increased, so that erosion takes place to a large extent. Furthermore, it becomes difficult to maintain the dispersion of the abrasive grains in the polishing compound, so that problems are caused in the dispersion stability, such as sedimentation and gelation with time.

In CMP, it is necessary to prevent Cu from being eroded by the polishing compound. Benzotriazole (hereinafter referred to as BTA) and its derivatives are known as most effective and widely used corrosion inhibitors for Cu and copper alloys (Takenori Notoya, Mechanism of Corrosion Inhibition of Benzotriazole-based Inhibitor, Japan Association of Corrosion control, 1986, p. 1). BTA forms dense films on the surfaces of Cu and Cu alloys and inhibits oxidation-reduction reactions, and thus etching is prevented. Therefore, BTA is an effective additive used for the polishing compound in order to prevent dishing in Cu wiring portions.

For example, JP-A-8-83780 discloses a method in which, by containing BTA or its derivative in a polishing compound, a protective film is formed on the surface of Cu, whereby dishing is prevented. However, in this method, it is not easy to add a sufficient amount of BTA that has a low solubility in water (solubility 1.98 wt % at 25° C.) to the polishing compound. If the amount of BTA added is increased, the dispersion balance of the polishing compound, which is a dispersion of abrasive grains, is disturbed, and sedimentation of the abrasive grains tends to occur with time, giving rise to problems such as low storage stability.

JP-A-10-74764 discloses a method of using an oxidizing acidic slurry, which contains colloidal alumina as abrasive grains, as a polishing compound for planarizing a metal film. This method is effective for polishing a barrier film which is composed of Nb. However, in the formation of Cu wirings, using Ta or its alloy for the barrier film, the removal rate and the surface smoothness of the obtained wirings are not sufficient.

Furthermore, JP-A-11-21546 discloses a polishing compound including a slurry containing abrasive grains composed of a metal oxide selected from cerium oxide, alumina, silica, titania, zirconia, and the like; urea; and hydrogen peroxide. However, in this polishing compound, the removal rate of the barrier film is extremely low relative to the removal rate of the Cu wirings, so that for example, such problems that dishing is apt to occur and the stability of the slurry is poor.

DISCLOSURE OF THE INVENTION

It is an object of the present invention to provide a polishing compound used for polishing a substrate provided with an insulating film on which a wiring metal film and a barrier film are formed, which the polishing compound makes it possible to form a gap filling with high reliability and excellent electrical characteristics with a small number of scratches, even at a high removal rate while suppressing dishing and erosion. The polishing compound consists of a slurry in which abrasive grains are dispersed. In the polishing compound, sedimentation, gelation, or the like does not easily occur with time, and satisfactory stability is exhibited.

The present invention provides a chemical mechanical polishing compound for polishing a substrate, which polishing compound comprises the following components (A), (B), (C), (D) and (E), and also provides a method for producing the polishing compound:

(A) fine oxide particles,
(B) an oxidizing agent,
(C) a compound represented by the Formula 1:

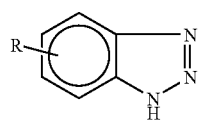

Formula 1

(wherein R is a hydrogen atom, an alkyl group having from 1 to 4 carbon atoms, an alkoxy group having from 1 to 4 carbon atoms, or a carboxyl group);
(D) water, and
(E) at least one compound selected from the group consisting of a primary alcohol having from 1 to 4 carbon atoms, a glycol having from 2 to 4 carbon atoms, an ether represented by the formula 2:

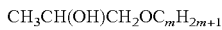

Formula 2

(wherein m is an integer of from 1 to 4), N-methyl-2-pyrrolidone, N,N-dimethylformamide, dimethyl sulfoxide, γ-butyrolactone, and propylene carbonate.

The present invention also provides a polishing method comprising the steps of supplying a polishing compound to a polishing pad on a polishing platen, bringing a surface to be polished into contact with the polishing compound, and relatively moving the surface to be polished and the polishing pad, characterized in that a substrate provided with a metal interconnect film and a barrier film is polished by the above-mentioned polishing compound.

BRIEF DESCRIPTION OF THE DRAWINGS

FIG. 1(a) shows the state before polishing; FIG. 1(b) shows the state after a first polishing step in which a wiring metal film is removed; and FIG. 1(c) shows the state after a second polishing step in which a barrier film is removed.

FIG. 2(a) shows the state before polishing; and FIG. 2(b) shows the state after polishing.

FIG. 3(a) shows the state before polishing; and FIG. 3(b) shows the state after polishing.

BEST MODE FOR CARRYING OUT THE INVENTION

Figure 1:
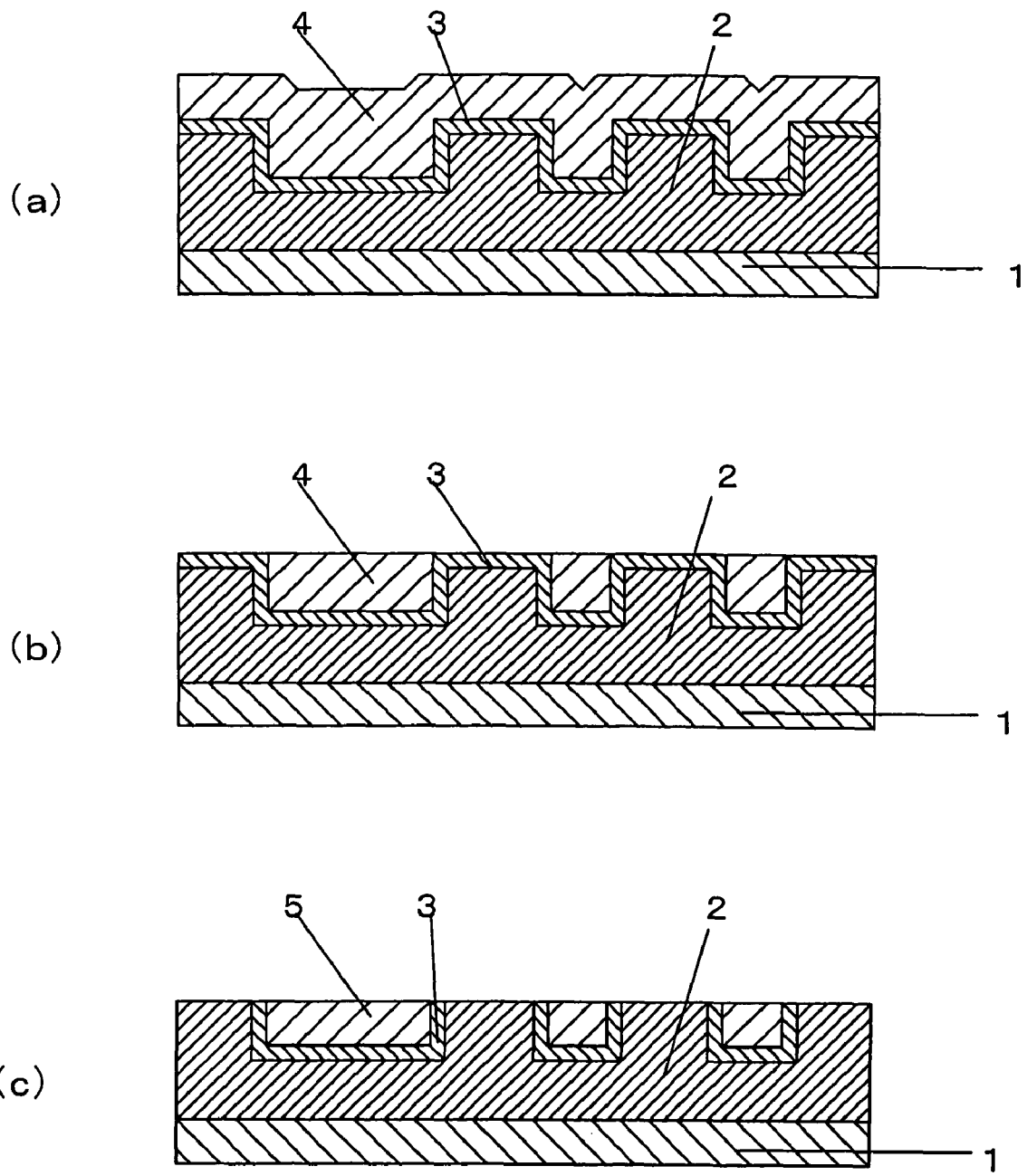
FIG. 1 includes sectional views which show the steps of a method for forming embedded wirings by CMP.
Figure 2:
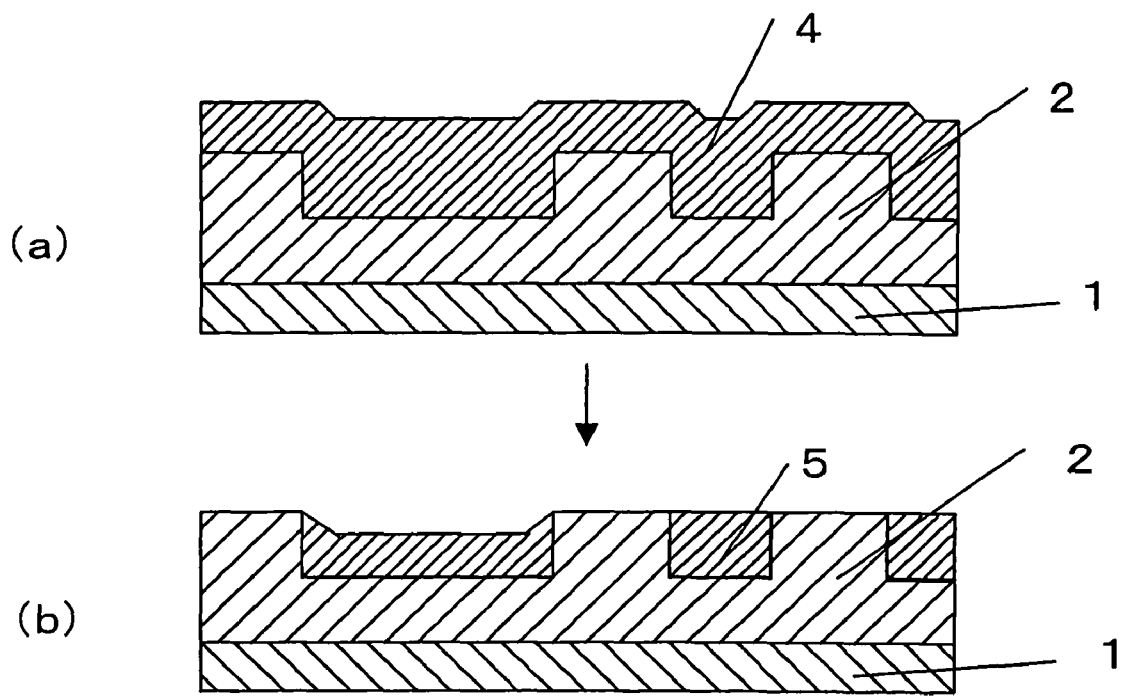
FIG. 2 includes sectional views which show the process of the generation of dishing.
Figure 3:
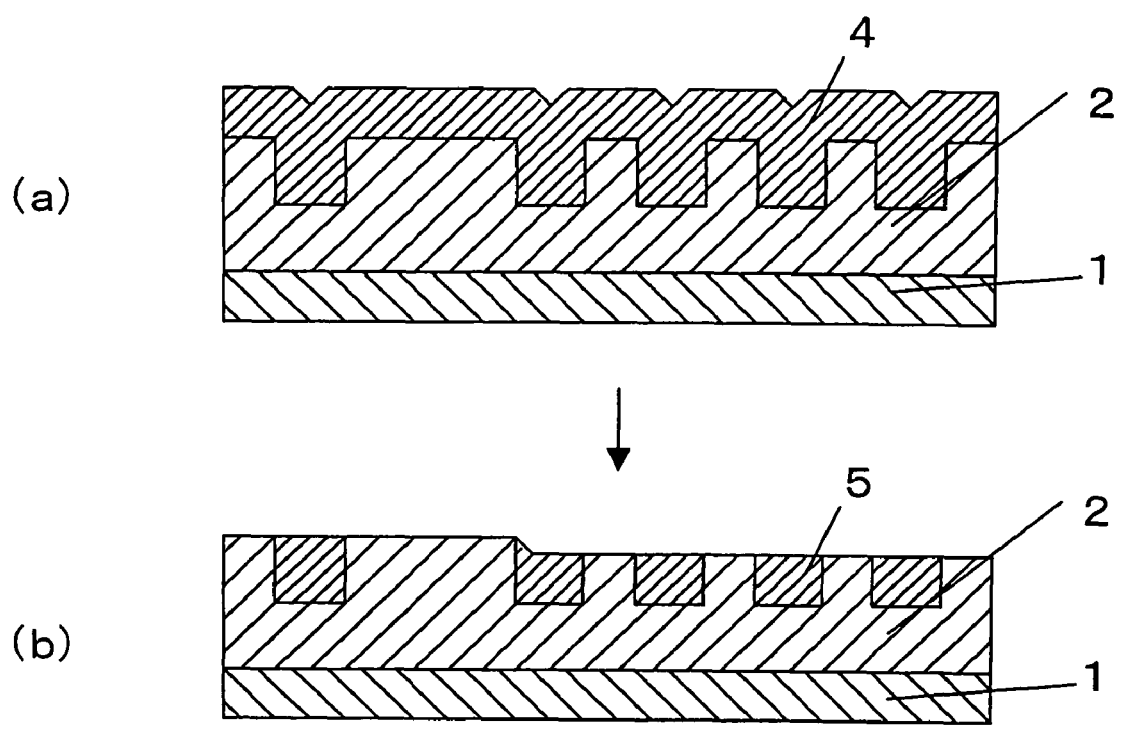
FIG. 3 includes sectional views which show the process of the generation of erosion.

Preferred embodiments of the present invention will be described below. A polishing compound of the present invention (hereinafter referred to as "the polishing compound") is suitable as a CMP polishing compound used for polishing a wiring metal film and a barrier film formed on a semiconductor substrate. In particular, the polishing compound is suitable for use in a process in which a substrate is subjected to CMP to form electrical connections such as embedded wirings and via holes, wherein the substrate is provided with an insulating film having gap, a barrier film composed of Ta, a tantalum alloy, or a tantalum compound such as tantalum nitride, formed on the insulating film, and a wiring metal film which fills in the gap. In a two-stage polishing method in which polishing of a wiring metal film and polishing of a barrier film are separately performed, the polishing compound is particularly suitable for use in a second polishing step carried out after the barrier film is exposed. The polishing compound may be used in a first polishing step.

In the polishing compound, the component (A)(fine oxide particles) is abrasive grains. Specifically, the component (A) is preferably composed of at least one oxide selected from the group consisting of silica, alumina, cerium oxide (ceria), zirconium oxide (zirconia), titanium oxide (titania), tin oxide, zinc oxide, germanium oxide and manganese oxide. Various types of silica produced by known methods may be used. Examples thereof include fumed silica prepared by subjecting silicon tetrachloride to vapor phase synthesis in a hydrogen oxygen flame, colloidal silica prepared from sodium silicate using an ion exchange process, and colloidal silica prepared by liquid phase hydrolysis of a silicon alkoxide. Similarly, colloidal alumina is also preferably used. Cerium oxide, zirconium oxide, titanium oxide, tin oxide and zinc oxide prepared by a liquid phase process or vapor phase process are also preferably used. Among these oxides, colloidal silica is more preferable since it can be obtained with high purity and with a uniform particle size.

The mean particle diameter of the component (A) is preferably from 5 to 500 nm, more preferably from 10 to 300 nm in view of the polishing characteristics and the dispersion stability. Preferably, the concentration of the component (A) in the polishing compound is appropriately set in a range of from 0.5% to 20% relative to the total mass of the polishing compound in consideration of the removal rate, uniformity, material selectivity, dispersion stability, and others.

The component (B) (oxidizing agent) forms an oxide film on the surface of the barrier film and accelerates the polishing of the barrier film by mechanically removing the oxide film from the surface of the substrate. Preferably, the component (B) is at least one compound selected from the group consisting of hydrogen peroxide, iodates, periodates, hypochlorites, perchlorates, persulfates, percarbonates, perborates and superphosphates. As iodates, periodates, hypochlorites, perchlorates, persulfates, percarbonates, perborates and superphosphates, there can be used in the forms of ammonium salts and alkali metal salts such as potassium salts. Above all, hydrogen peroxide is more preferable because it does not contain alkali metal components and does not produce hazardous by-products.

Preferably, the concentration of the component (B) in the polishing compound is appropriately set in a range of from 0.5% to 20% relative to the total mass of the polishing compound in consideration of the removal rate, homogeneity of the polishing slurry, and others.

The component (C) has a function of forming a protective film on the wiring metal surface in order to prevent the occurrence of dishing in the wiring metal portion. When the wiring metal is composed of Cu, any compound which physically or chemically adsorbs on the surface of the Cu to form a film and to prevent Cu from dissolving may be used as the component (C). As such a compound, there can be given a compound represented by the Formula 1:

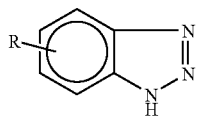

Formula 1 wherein R is a hydrogen atom, an alkyl group having from 1 to 4 carbon atoms, an alkoxy group having from 1 to 4 carbon atoms, or a carboxyl group.

Specific examples of the compound include BTA, tolyltriazole (TTA) which is obtained by substituting a methyl group for a hydrogen atom in the fourth or fifth position of the benzene ring of BTA, and benzotriazole-4-carboxylic acid which is obtained by substituting a carboxyl group for the hydrogen atom. These may be used alone or in combination of two or more. In view of the polishing characteristics, the content of the component (C) is preferably from 0.001% to 5%, more preferably from 0.002% to 0.5% relative to the total mass of the polishing compound.

In the polishing compound, the component (A) which is abrasive grains, is dispersed mainly in water (the component (D)). Since the component (C) has a low solubility in water, if the component (C) is directly mixed with water or a dispersion in which the component (A) is dispersed in water, the dispersion stability of the polishing component is apt to be decreased. Therefore, in the method for producing the polishing compound according to the present invention, the component (C) is preferably dissolved in an organic solvent capable of dissolving the component (C) at a high concentration before being mixed with a dispersion in which the component (A) is dispersed in water. In the present invention, the component (E) is used as the above-mentioned organic solvent. For example, while the solubility of BTA in water is 1.98 wt %, the solubility in methyl alcohol is 71.6 wt %, the solubility in isopropyl alcohol (hereinafter referred to as "IPA") is 53.9 wt %, and the solubility in ethylene glycol is 50.7 wt %, each at 25° C. By dissolving the component (C) in the component (E) in advance and then by adding the solution to the dispersion in which the component (A) is dispersed, the polishing compound can be produced in a stable manner while preventing local segregation in the production process.

The component (E) is at least one compound selected from the group consisting of a primary alcohol having from 1 to 4 carbon atoms, a glycol having from 2 to 4 carbon atoms, an ether represented by $CH_3CH(OH)CH_2O-C_mH_{2m+1}$ (the Formula 2) (wherein m is an integer of from 1 to 4), N-methyl-2-pyrrolidone, N,N-dimethylformamide, dimethyl sulfoxide, γ-butyrolactone and propylene carbonate. Specifically, as the primary alcohol, methyl alcohol, ethyl alcohol or IPA is preferable.

As the glycol, ethylene glycol (hereinafter referred to as "EG") or propylene glycol (hereinafter referred to as "PG") is preferable. As the ether, propylene glycol methyl ether (hereinafter referred to as "PGM") or propylene glycol ethyl ether (hereinafter referred to as "PGE") is preferable.

Furthermore, N-methyl-2-pyrrolidone, N,N-dimethyl-formamide, dimethyl sulfoxide, γ-butyrolactone, and propylene carbonate are polar solvents with a dielectric constant of from 30 to 65 at 25° C., and can dissolve an electrolyte at a high concentration by solvation. That is, each of these solvents makes it possible to prepare a solution in which the component (C) is dissolved at a high concentration, and is also effective in the production process of adding the solution to the dispersion in which the component (A) is dispersed in water.

The component (E) also has a function of controlling the fluidity of the polishing compound. In the polishing method including the steps of supplying a polishing compound to a polishing pad on a polishing platen, bringing a surface to be polished into contact with the polishing compound, and relatively moving the surface to be polished and the polishing pad, it is important to efficiently supply the polishing compound between the surface to be polished and the polishing pad and to efficiently remove swarf. For example, when the surface tension or viscosity of the polishing compound is high, it is not possible to efficiently supply the polishing compound and remove swarf, so that the removal rate is decreased. Since the polishing compound contains water (the component (D)) having high surface tension, the use of the component (E) is necessary for the adjustment of the fluidity of the polishing compound.

Of the above-mentioned examples of the component (E), in particular, at least one substance selected from the group consisting of methyl alcohol, ethyl alcohol, ethylene glycol and N-methyl-2-pyrrolidone is more preferable in terms of the polishing characteristics and dispersion stability of the polishing component.

In view of the polishing characteristics and dispersion stability, the content of the component (E) is preferably from 0.01% to 50%, more preferably from 0.5% to 30%, relative to the total mass of the polishing compound.

The content of water (the component (D)) is preferably from 40% to 98%, more preferably from 60% to 90%, relative to the total mass of the polishing compound. As mentioned above, water along with the component (E) controls the fluidity of the polishing compound, so that the water content is appropriately set in accordance with the desired polishing characteristics, such as removal rate and planarization performances.

The polishing compound also contains fine oxide particles as the component (A). Surface hydroxyl groups are present on the fine oxide particles, and their activity generally increases as the particle diameter decreases, and changes with time due to aggregation and gelation are apt to occur. The inventors of the present invention have discovered that by containing the component (E), the aggregation and gelation of the polishing compound can be inhibited and the initial polishing performance by the polishing compound can be maintained for a long period of time. By using the polishing compound of which dispersion stability can be maintained for a long period of time, there can be formed reliable gap filling line which have excellent electrical characteristics with low degrees of dishing and erosion and a small number of scratches while maintaining a high removal rate of the barrier film.

In addition to the components (A) to (E), the polishing compound preferably contains an acid. As such an acid, preferable is at least one acid selected from the group consisting of nitric acid, sulfuric acid and carboxylic acid. Of these acids, nitric acid is more preferable, which is an oxidative oxo acid free of a halogen. The concentration of the acid in the polishing compound is preferably from 0.01% to 20% relative to the total mass of the polishing compound.

In order to adjust the pH of the polishing compound to a predetermined value, an alkaline compound may be added to the polishing compound together with the acid. As such an alkaline compound, there can be used, for example, ammonia, potassium hydroxide, and quaternary ammonium hydroxides such as tetramethylammonium hydroxide and tetraethylammonium hydroxide (hereinafter referred to as "TEAH"). When it is desired that no alkali metals be contained, ammonia is suitable.

In view of the polishing performance and the dispersion stability of the polishing compound, the pH of the polishing compound is preferably controlled to be in a range of from 2 to 9 or from 3 to 9. In particular, when silica is used as abrasive grains, the pH is preferably in a range of from 3 to 5, or from 7 to 9. When the pH is in either range, silica is stable in the polishing compound. The pH range is selected in accordance with the desired selection ratio of the removal rate of Cu, the insulating film and Ta.

In order to adjust the pH, a pH buffering agent may be added to the polishing compound. As such a pH buffering agent, any substance may be used as long as it has a pH buffering ability in general use. Preferably used is at least one substance selected from the group consisting of succinic acid, citric acid, oxalic acid, phthalic acid, tartaric acid and adipic acid which are polycarboxylic acids. Glycylglycine and alkali carbonate may also be used. When the metal line is composed of Cu, succinic acid is preferable, of which complexation coefficient with respect to Cu is not as high as that of citric acid, in order to control the removal rate of Cu and to prevent dishing. Furthermore, the concentration of the pH buffering agent in the polishing compound is preferably from 0.01% to 10% relative to the total mass of the polishing compound.

The polishing compound is suitable for use in polishing a substrate provided with a wiring metal film and a barrier film. In such a case, the polishing compound is highly effective when the barrier film is composed of at least one substance selected from the group consisting of Ta, a tantalum alloy, and a tantalum compound. However, the polishing compound can also be used for films composed of other metals, etc., and the same effect can be obtained when the barrier film is composed of a metal or a metal compound other than Ta, for example, Ti, TiN, TiSiN or WN.

The polishing compound is also highly effective when the wiring metal film is composed of at least one substance selected from the group consisting of Cu, copper alloys and copper compounds. The same effect can also be obtained when the wiring metal film is a metal film composed of a metal other than Cu, for example, Al, W, Ag, Pt or Au. Examples of the insulating film on the substrate include films composed of low-dielectric constant materials, such as a film composed of silicon dioxide or SiOF, an organic SOG film (film containing an organic component formed by a spin on glass process), and a porous silica film.

The polishing method of the present invention is such that the polishing compound is supplied to a polishing pad on a polishing platen, a surface to be polished is brought into contact with the polishing compound, and the surface to be polished and the polishing pad are relatively moved. When necessary, polishing may be performed while the surface of the polishing pad is being subjected to conditioning by bringing a pad conditioner into contact with the surface of the polishing pad.

The polishing compound is suitable for use with a method for forming a gap filling in a substrate provided with an insulating film, a barrier film, and a Cu film, in which substrate recesses such as trench patterns or via holes for wiring are formed in the insulating film, and the barrier film is formed thereon, and then Cu is deposited so as to be filled in gap by sputtering, plating, or the like, and in which method, the Cu film and the barrier film are removed by CMP until the surface of the insulating film is exposed in portions other than the portions corresponding to the recesses. Specifically, in a two-stage polishing method as shown in FIG. 1, when the polishing compound is used in a second polishing step in which the substrate shown in FIG. 1(*b*) is polished to the state shown in FIG. 1(*c*), dishing and erosion are preferably made difficult to take place.

The present invention will now be explained more specifically with reference to Examples (Examples 1 to 11, 14 to 19 and 22 to 24) and Comparative Examples (Examples 12, 13, 20 and 21). However, it is to be understood that the present invention is not limited thereto.

Preparation of Polishing Compound

An acid, an alkali and a pH buffering agent were added to pure water, followed by stirring for 10 minutes (liquid a). A component (C) was then dissolved in an organic solvent (component (E)) (liquid b). The liquid b was added to the liquid a, and stirring was performed for another 10 minutes (liquid c).

Next, a dispersion of fine oxide particles (component (A)) was slowly added to the liquid c, and then an alkaline compound was slowly added thereto to adjust the pH. An aqueous solution of an oxidizing agent was further added thereto, followed by stirring for 30 minutes, whereby a polishing compound was obtained. Table 1 shows the types of the component (C), component (E) and component (A) and the concentrations (%) thereof relative to the total mass of the polishing compound, and the pH of the polishing compound used in each Example. Table 2 shows the types of the oxidizing agent, acid, alkali and pH buffering agent used and the concentrations (%) thereof relative to the total mass of the polishing compound.

Polishing Conditions

Polishing was performed using the following machine and under the following conditions.

Polishing machine: Fully Automatic CMP Apparatus MIRRA (made by Applied Materials, Inc.), Polishing pressure: 20 kPa, Rotational frequency: Platen 103 rpm, Head (substrate holding portion) 97 rpm, Polishing compound supply rate: 200 ml/min, Polishing pad: IC1000 (made by Rodel, Inc.)

Workpiece to be Polished (Blanket Wafers)
(1) Wafer for evaluating removal rate of Cu (wiring metal film): 8-inch wafer comprising a substrate and a 1,500 nm thick Cu layer deposited thereon by plating
(2) Wafer for evaluating removal rate of Ta (barrier film): 8-inch wafer comprising a substrate and a 200 nm thick Ta layer deposited thereon by sputtering
(3) Wafer for evaluating removal rate of $SiO_2$ (insulating film): 8-inch wafer comprising a substrate and an 800 nm thick $SiO_2$ layer deposited thereon by plasma CVD
(Each of the wafers (1) to (3) made by International SEMATECH)

(Patterned Wafer)
An 8-inch wafer (trade name: 831CMP000, made by International SEMATECH) fabricated by forming a line pattern with a line density of 50% and line widths of 5 μm and 50 μm on an insulating film formed on a substrate, forming a 25 nm thick Ta layer by sputtering on the line-pattern-formed insulating film, and further forming thereon a 1500 nm thick Cu layer by plating.

Method for Evaluating the Characteristics of the Polishing Compound

The blanket wafers were used to evaluate the removal rates of the wiring metal film, the barrier film and the insulating film, and the patterned wafers were used to evaluate dishing and erosion. When the patterned wafers were polished, a two-stage polishing method including a first polishing step of removing the wiring metal film and a second polishing step of removing the barrier film was carried out. As the polishing compound for the first polishing step, there was used a polishing compound containing alumina, hydrogen peroxide, citric acid, ammonium polyacrylate and water in the concentrations of 3%, 4%, 0.1%, 0.05% and 92.85, respectively, relative to the total mass of the polishing compound. This polishing compound was used in the first polishing step in all of the Examples and Comparative Examples.

When Ta on the insulating film was exposed after the first polishing step, the dishing at the position of the line width of 5 μm was 40 nm, and the dishing at the position of the line width of 50 μm was 60 nm. The erosion was 0 nm at any of the line widths. Thereafter, a second polishing step was carried out until Ta on the insulating film disappeared, using the polishing compound with the composition shown in Tables 1 and 2 in each of the Examples.

The polishing characteristics were evaluated by the following methods. The removal rate was calculated based on the thickness of the film before polishing and the thickness after polishing. For the measurement of the thickness of the film, with respect to Cu and Ta, there was used a sheet resistance measuring apparatus RS75 (made by KLA-Tencor Corporation), in which apparatus the thickness was calculated based on the surface resistance by a four probe method. With respect to the insulating film, an optical interference-type, fully automatic film thickness measuring apparatus UV1280SE (made by KLA-Tencor Corporation) was used. With respect to the planarization performance of the dishing and erosion, a high resolution profiler HRP100 (made by KLA-Tencor Corporation) was used, which measured the differences in level by using a stylus.

The dispersion stability of the polishing compound was evaluated by assessing the changes in the mean particle diameter by measuring the mean particle diameter immediately after the preparation thereof and that in one month after the preparation thereof. The mean particle diameter was measured using a Microtrac UPA particle analyzer (made by Nikkiso Co., Ltd.). In Table 4, ◯ denotes an increase in the mean particle diameter within a range of 50%, and x denotes an increase in the mean particle diameter greater than the range of 50%.

Table 3 shows the removal rate (nm/min) of each of the Cu, Ta, $SiO_2$ films. Table 4 shows the differences in level (nm) caused by the dishing and the erosion, and also the dispersion stability of the polishing compounds.

TABLE 1

| | Component (C) | | Component (E) | | | Component (A) | |
|---|---|---|---|---|---|---|---|
| | Substance | Concentration | Substance | Concentration | pH | Substance | Concentration |
| Ex. 1 | BTA | 1.0 | Methanol | 20 | 7.0 | Silica | 10 |
| Ex. 2 | BTA | 0.2 | Ethanol | 20 | 4.0 | Silica | 4 |
| Ex. 3 | BTA | 0.2 | IPA | 5 | 4.0 | Silica | 4 |
| Ex. 4 | BTA | 0.2 | EG | 5 | 4.0 | Silica | 4 |
| Ex. 5 | TTA | 0.2 | PG | 5 | 3.0 | Silica | 4 |
| Ex. 6 | TTA | 0.2 | PGM | 0.1 | 3.0 | Silica | 4 |
| Ex. 7 | TTA | 0.2 | PGE | 0.1 | 3.0 | Silica | 4 |
| Ex. 8 | BTA | 0.5 | EG | 5 | 4.0 | Alumina | 4 |
| Ex. 9 | BTA | 0.01 | EG | 5 | 4.0 | Ceria | 4 |
| Ex. 10 | BTA | 0.01 | EG | 5 | 4.0 | Titania | 4 |
| Ex. 11 | BTA | 0.05 | EG | 5 | 4.0 | Zirconia | 4 |
| Ex. 12 | None | — | Methanol | 10 | 9.0 | Alumina | 4 |
| Ex. 13 | BTA | 0.1 | None | — | 4.0 | Silica | 4 |
| Ex. 14 | BTA | 1.0 | NMP | 20 | 7.0 | Silica | 10 |
| Ex. 15 | BTA | 0.2 | NMP | 20 | 4.0 | Alumina | 4 |
| Ex. 16 | BTA | 0.2 | DMFA | 20 | 4.0 | Silica | 4 |
| Ex. 17 | BTA | 0.2 | DMSO | 5 | 4.0 | Silica | 4 |
| Ex. 18 | TTA | 0.2 | BL | 5 | 3.0 | Silica | 4 |
| Ex. 19 | TTA | 0.2 | PC | 5 | 3.0 | Silica | 4 |
| Ex. 20 | None | 0 | None | 0 | 3.0 | Silica | 4 |
| Ex. 21 | BTA | 0.1 | None | 0 | 4.0 | Silica | 4 |
| Ex. 22 | BTA | 0.005 | EG | 1 | 8.0 | Silica | 4 |
| Ex. 23 | BTA | 0.005 | NMP | 1 | 8.0 | Silica | 4 |
| Ex. 24 | BTA | 0.001 | NMP | 1 | 9.0 | Silica | 4 |

TABLE 2

| | Component (B) | | Acid | | Alkali | | pH buffering agent | |
|---|---|---|---|---|---|---|---|---|
| | Substance | Concentration | Substance | Concentration | Substance | Concentration | Substance | Concentration |
| Ex. 1 | Hydrogen peroxide | 5 | Nitric acid | 1 | Ammonia | 0.5 | Succinic acid | 0.2 |
| Ex. 2 | Hydrogen peroxide | 5 | Nitric acid | 1 | Ammonia | 0.5 | Succinic acid | 0.2 |
| Ex. 3 | Hydrogen peroxide | 5 | Nitric acid | 1 | Ammonia | 0.5 | Succinic acid | 0.2 |

TABLE 2-continued

| | Component (B) | | Acid | | Alkali | | pH buffering agent | |
|---|---|---|---|---|---|---|---|---|
| | Substance | Concentration | Substance | Concentration | Substance | Concentration | Substance | Concentration |
| Ex. 4 | Hydrogen peroxide | 5 | Nitric acid | 1 | Ammonia | 0.5 | Succinic acid | 0.2 |
| Ex. 5 | Hydrogen peroxide | 5 | Nitric acid | 1 | Ammonia | 0.5 | Succinic acid | 0.2 |
| Ex. 6 | Hydrogen peroxide | 5 | Nitric acid | 1 | Ammonia | 0.5 | Succinic acid | 0.2 |
| Ex. 7 | Hydrogen peroxide | 5 | Nitric acid | 1 | Ammonia | 0.5 | Succinic acid | 0.2 |
| Ex. 8 | Hydrogen peroxide | 5 | Nitric acid | 1 | Ammonia | 0.5 | Succinic acid | 0.2 |
| Ex. 9 | Hydrogen peroxide | 5 | Nitric acid | 1 | Ammonia | 0.5 | Citric acid | 0.2 |
| Ex. 10 | Hydrogen peroxide | 5 | Nitric acid | 1 | Ammonia | 0.5 | Tartaric acid | 0.2 |
| Ex. 11 | Ammonium persulfate | 5 | Sulfuric acid | 1 | TEAH | 0.5 | Glycylglycine | 0.2 |
| Ex. 12 | Hydrogen peroxide | 5 | Nitric acid | 0.5 | KOH | 0.5 | Succinic acid | 0.2 |
| Ex. 13 | Ammonium persulfate | 1 | Nitric acid | 1 | Ammonia | 0.3 | Citric acid | 0.2 |
| Ex. 14 | Hydrogen peroxide | 5 | Nitric acid | 1 | Ammonia | 0.5 | Succinic acid | 0.2 |
| Ex. 15 | Hydrogen peroxide | 5 | Nitric acid | 1 | Ammonia | 0.5 | Succinic acid | 0.2 |
| Ex. 16 | Hydrogen peroxide | 5 | Nitric acid | 1 | Ammonia | 0.5 | Succinic acid | 0.2 |
| Ex. 17 | Hydrogen peroxide | 5 | Nitric acid | 1 | Ammonia | 0.5 | Succinic acid | 0.2 |
| Ex. 18 | Hydrogen peroxide | 5 | Nitric acid | 1 | Ammonia | 0.5 | Succinic acid | 0.2 |
| Ex. 19 | Hydrogen peroxide | 5 | Nitric acid | 1 | Ammonia | 0.5 | Succinic acid | 0.2 |
| Ex. 20 | Hydrogen peroxide | 5 | Nitric acid | 0.5 | KOH | 0.5 | Succinic acid | 0.2 |
| Ex. 21 | Hydrogen peroxide | 5 | Nitric acid | 1 | Ammonia | 0.3 | Succinic acid | 0.2 |
| Ex. 22 | Hydrogen peroxide | 1 | Nitric acid | 1 | KOH | 1.5 | Citric acid | 0.2 |
| Ex. 23 | Hydrogen peroxide | 1 | Nitric acid | 1 | KOH | 1.5 | Citric acid | 0.2 |
| Ex. 24 | Hydrogen peroxide | 1 | Nitric acid | 1 | KOH | 1.5 | Citric acid | 0.2 |

TABLE 3

| | Cu removal rate | Ta removal rate | $SiO_2$ removal rate |
|---|---|---|---|
| Example 1 | 80 nm/min | 160 nm/min | 15 nm/min |
| Example 2 | 50 | 120 | 10 |
| Example 3 | 60 | 120 | 10 |
| Example 4 | 40 | 110 | 10 |
| Example 5 | 50 | 110 | 10 |
| Example 6 | 30 | 120 | 10 |
| Example 7 | 40 | 120 | 5 |
| Example 8 | 20 | 100 | 5 |
| Example 9 | 30 | 100 | 5 |
| Example 10 | 30 | 100 | 5 |
| Example 11 | 30 | 100 | 5 |
| Example 12 | 150 | 50 | 50 |
| Example 13 | 50 | 30 | 40 |
| Example 14 | 30 | 120 | 10 |
| Example 15 | 50 | 110 | 10 |
| Example 16 | 60 | 110 | 10 |
| Example 17 | 40 | 110 | 10 |
| Example 18 | 50 | 110 | 10 |
| Example 19 | 30 | 100 | 10 |
| Example 20 | 180 | 40 | 50 |
| Example 21 | 50 | 30 | 40 |
| Example 22 | 40 | 100 | 80 |
| Example 23 | 40 | 100 | 80 |
| Example 24 | 30 | 100 | 60 |

TABLE 4

| | Dishing | | Erosion | | Dispersion stability |
|---|---|---|---|---|---|
| | 5 μm | 50 μm | 5 μm | 50 μm | |
| Example 1 | 20 | 80 | 60 | 20 | ○ |
| Example 2 | 10 | 40 | 40 | 10 | ○ |
| Example 3 | 15 | 40 | 40 | 10 | ○ |
| Example 4 | 20 | 40 | 40 | 15 | ○ |
| Example 5 | 20 | 40 | 40 | 15 | ○ |
| Example 6 | 20 | 50 | 40 | 20 | ○ |
| Example 7 | 15 | 50 | 40 | 20 | ○ |
| Example 8 | 15 | 60 | 50 | 15 | ○ |
| Example 9 | 15 | 60 | 50 | 15 | ○ |

TABLE 4-continued

|  | Dishing | | Erosion | | Dispersion |
|---|---|---|---|---|---|
|  | 5 μm | 50 μm | 5 μm | 50 μm | stability |
| Example 10 | 15 | 60 | 50 | 15 | ○ |
| Example 11 | 15 | 60 | 50 | 15 | ○ |
| Example 12 | 50 | 150 | 150 | 100 | ○ |
| Example 13 | 50 | 100 | 100 | 50 | × |
| Example 14 | 10 | 30 | 50 | 20 | ○ |
| Example 15 | 10 | 40 | 40 | 10 | ○ |
| Example 16 | 15 | 40 | 40 | 10 | ○ |
| Example 17 | 20 | 40 | 40 | 15 | ○ |
| Example 18 | 20 | 40 | 40 | 15 | ○ |
| Example 19 | 20 | 50 | 40 | 20 | ○ |
| Example 20 | 60 | 180 | 160 | 100 | × |
| Example 21 | 60 | 110 | 50 | 50 | × |
| Example 22 | 20 | 30 | 30 | 10 | ○ |
| Example 23 | 20 | 30 | 30 | 10 | ○ |
| Example 24 | 20 | 40 | 40 | 20 | ○ |

INDUSTRIAL APPLICABILITY

The use of the polishing compound of the present invention in polishing a substrate provided with an insulating film, and a wiring metal film and a barrier film formed on the insulating film makes it possible to form an embedded wiring portion having high reliability and excellent electrical characteristics, with a small number of scratches, at a high removal rate while suppressing dishing and erosion. Moreover, the polishing compound of the present invention does not easily cause sedimentation, gelation, or the like with time, and has excellent dispersion stability.

The entire disclosures of Japanese Patent Application No. 2001-329148 filed on Oct. 26, 2001 and Japanese Patent Application No. 2001-353207 filed on Nov. 19, 2001 including specifications, claims, drawings and summaries are incorporated herein by reference in their entireties.

What is claimed is:

1. A polishing method comprising
supplying a polishing compound to a polishing pad on a polishing platen, bringing a surface to be polished into contact with the polishing compound, and relatively moving the surface to be polished and the polishing pad, wherein a substrate on which a wiring metal film, a barrier film and an insulating film are formed is polished and wherein the polishing compound comprises (A) 4 to 10 mass % of silica particles, (B) 1 to 5 mass % of an oxidizing agent selected from the group consisting of hydrogen peroxide, persulfate, or a combination thereof, (C) 0.001 to 0.2 mass % of a compound represented by the Formula 1

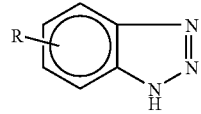

Formula 1 where R is a hydrogen atom or a methyl group, (D) 60 to 98 mass % of water, (E) 0.1 to 5 mass % of at least one substance selected from the group consisting of ethylene glycol, propylene glycol methyl ether, (F) 0.01 to 1 mass % of nitric acid, (G) an alkaline compound comprising a member selected from the group consisting of KOH, and ammonia, present in an amount such that the composition has a pH in a range of 3 to 4 and wherein the composition has a removal rate of Ta of from 30 to 160 nm and which is higher than that of Cu removal rate of 30 to 150 nm when applied to a wiring metal film, a barrier film and an insulating film containing a film of Ta and a film of Cu.

2. The polishing method according to claim 1, wherein the barrier film comprises tantalum, a tantalum alloy or a tantalum compound, and said wiring metal film comprises copper, a copper alloy or a copper compound.

3. The method according to claim 1, wherein the component (A) is colloidal silica.

* * * * *